United States Patent [19]

Sharp et al.

[11] Patent Number: 4,885,482
[45] Date of Patent: Dec. 5, 1989

[54] MULTIPLE COMPUTER INTERFACE CIRCUIT BOARD

[75] Inventors: David P. Sharp, Houston; Charles H. Lee, Cypress; Thomas Cassidy, Houston, all of Tex.

[73] Assignee: Compaq Computer Corporation, Houston, Tex.

[21] Appl. No.: 218,652

[22] Filed: Jul. 13, 1988

[51] Int. Cl.⁴ .............................................. G06F 13/38
[52] U.S. Cl. .................................... 307/465; 361/413; 364/200; 439/62; 307/475
[58] Field of Search ............... 307/465, 276, 303, 475; 361/395, 399, 413, 415; 439/59, 62, 65; 364/200 MS File, 900 MS File Primary Examiner—David Hudspeth
Attorney, Agent, or Firm—Pravel, Gambrell, Hewitt, Kimball & Krieger

[57] ABSTRACT

A circuit board for use with two different interface standards of different computer systems. The circuit board contains interfaces to two or more different standards so that one board can be inserted into two different mother boards. The interface on the board can be card edges for edge connectors, pin and socket connectors or others. The circuit board also includes provisions for the mounting of appropriate end plates. The circuit board further includes circuitry for selecting the appropriate circuitry configuration for the active interface standard, either automatically or based on a manual selection.

14 Claims, 2 Drawing Sheets

MULTIPLE COMPUTER INTERFACE CIRCUIT BOARD

BACKGROUND OF THE INVENTION

1. Field of the Invention

The present invention relates to circuit boards which are installed in computer systems.

2. Description of the Prior Art

Many computers and computer systems employ what are called "mother boards," "system boards," or "back planes" which contain signal busses and electrical connectors. The busses and connectors are interfaces which are used to allow additional circuit boards to be used in the computer system so that different configurations and expansions of the system can be developed. In order to allow the additional circuit boards and the circuitry contained thereon to function correctly, specifications relating to the mechanical connections, the number of pins and arrangement, the electrical requirements, and the signal protocol and meaning are developed for each interface. Some interface or slots in a given system may have a particular meaning and have a different specification, while in other systems all of the slots or interfaces may be similar.

As a result of the development of these specifications, what is referred to as an interface standard is developed for use with each computer or computer system. Because of the great proliferation of different computer system designs and different busses and interfaces used in these systems, there are a large number of interface standards for which circuit boards must be developed. Generally the interface standards for different systems have different arrangements and have different timing, voltage and signal content characteristics. Many of the interfaces use a plated card edge on the circuit board and edge connectors on the mother board to perform the connection, but the number of pins or contacts, the spacing of the contacts and the number of sets of contacts varies from standard to standard. Other designs use plug and socket or pin and socket connectors on the circuit boards with complementary connectors mounted on the mother boards, again with the physical parameters such as the number of rows of pins, the number of pins per row, the pin spacing, the number of connectors varying between standards.

While the interface standards are different in many respects, in many respects there are commonalities between the different systems, such as the speed of the components, the word size of the information being transferred, the functions being performed by the additional circuit boards and other areas. Therefore a great number of similar but different circuit boards are developed for the varying interface standards. This great number of boards results in increased production costs due to lack of volume and increased inventory costs because of the need to stock different styles and types of boards for each system. Additionally, design costs are increased because of the amount of time required to properly develop and design a circuit board to work with the different standards.

SUMMARY OF THE INVENTION

A circuit board according to the present invention utilizes interfaces from different interface standards on the same circuit board. A first interface configured for a first interface standard is located on a first edge or side of the circuit board, while a second interface configured for a second interface standard is located on a second edge or side of the circuit board. The interfaces can be formed by card edges and mating edge connectors, male and female pin and socket connectors, a combination of the above, or other interfaces based on the interface standards being combined on a given circuit boards. Depending upon the various physical parameters and spacings of the chassis, covers and mother board of the target computer systems, the circuit board may be the size of one, neither or both of the sizes recommended by the physical specification of the computer system.

Circuit boards often have connections to external or non-mother board devices, such as disk drives, modems and printers, on alternate edges of the circuit board or projecting from the circuit board. These connections can remain and be incorporated into the present circuit board design.

Some interface standards require end plates for connection into a chassis and require that the end plates meet certain physical parameters. A circuit board according to the present invention can be utilized in such systems. The end plates would preferably be attached to the circuit board in one of several ways, for example, either directly to the board or to connectors located on the appropriate board edge mounted to allow the end plates to meet the interface standard.

When the present invention is utilized, for example, by a computer system manufacturer, only the desired end plate and interface connectors for the desired interface standard are installed, while when, for example, the circuit board is being utilized by a circuit board manufacturer for after-market or original equipment purposes, end plates and interface connectors for both interface standards are supplied. In the computer manufacturer case, inventory is reduced and circuit board volume is increased across the manufacturer's various lines. In the board manufacturer case, volume is increased and inventory is reduced because of the flexibility of selling one product to consumers having different systems.

Additionally, circuitry can be provided on the circuit board to allow the appropriate circuitry to be enabled or activated to communicate according to the interface standard which is active. The appropriate selection can be performed by having separated power supply lines from each interface connected to the appropriate circuitry. Alternatively, the appropriate circuitry can be enabled manually by the use of switches. Preferably the circuitry located on the circuit board includes an interface logic device which allows easy adaptation to either desired interface standard. The adaptation can be initiated by the state of one or more inputs to the interface logic device or can be initiated by data received from a configuration memory.

DETAILED DESCRIPTION OF THE ALTERNATE EMBODIMENTS

Figure 1:
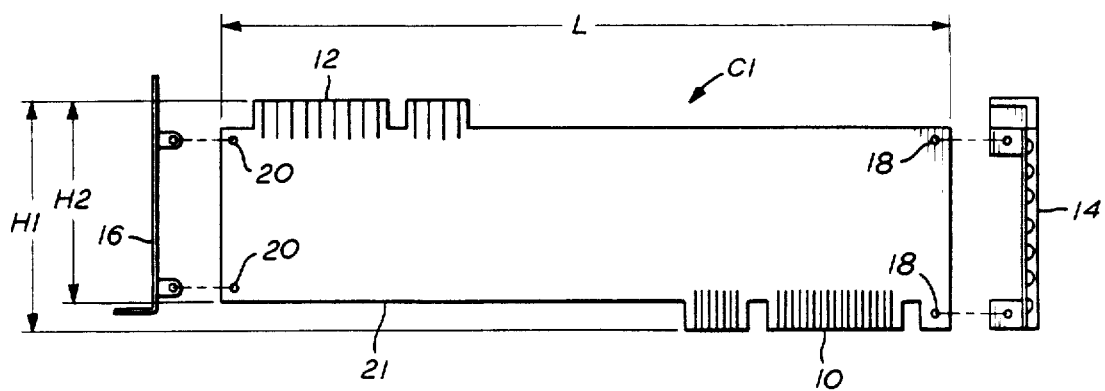
FIG. 1 is a side view of a circuit board according to the present invention having interfaces on opposite sides and utilizing two different end plates.

Referring now to the Figures, the letter C generally refers to a circuit board according to the present invention. Circuit board C1 (FIG. 1) has two plated card edges 10 and 12 configured for connection into the mother boards of two different computer systems having different interface standards. The first card edge 10 is configured for a first interface standard and has the pin spacing, pin quantity, signal connections and other parameters as required by the functionality of the circuit board C1 and the first interface standard. The second card edge 12 is configured for a seocnd interface standard and has the pin spacing, pin quantity, signal connections and other parameters as required by the functionality of the circuit board C1 and the second interface standard. For example, the circuit board C1 can be a memory board and have connections to the data, address and memory control areas of the interfaces, as well as the power supply areas. The card edges 10, 12 can be configured into several separate portions if required by the interface standard.

The circuit board C1 is of such a height that the alternate edge connector not inserted into the mother board will not interfere with the physical construction of the chassis and covers utilized in the particular computer system into which it is inserted. The length of the circuit board C1 can be only the length that is necessary for the location of the components and circuitry to be located on the circuit board C1 and need not conform to the length requirements of both interface standards. Of course, circuit board C1 can be longer than necessary if so desired by the designer.

The circuit board C1 includes provisions for attachment of the appropriate end plates 14, 16 for the respective computer systems. The first end plate 14 contains provisions such that it can be mounted by screws or other means through holes 18 located at the appropriate end of the circuit board C1. Circuit board C1 also contains the holes 20 to allow fastening of the other end plates 16 used in the alternate computer system. For example, the end plate 16 can be attached to the circuit board C1 by screws, rivets or pins as desired.

The circuit board C1 would be rotated 180 degrees about its center in the plane of the circuit board C1 for use of the card edge 12, assuming the mother board is resting on a horizontal surface, such as a desk top.

As an example, the circuit board C1 can be used in both an "IBM Personal System/2" personal computer system which utilizes a "MicroChannel Architecture" and "PS/2" interface standard and in an "IBM PC/XT", "IBM PC/AT", "Compaq Deskpro" or other "IBM"-compatible personal computer systems which utilize what is referred to as the "Industry Standard Architecture" and "PC/XT/AT" interface standard. A full length circuit board C1 for use with these two interface standards would have a length L of approximately 11.5 in., a height H1 from the card edge 10 to the alternate card edge 12 of approximately 3.8 in. and a height H2 from the end of alternate card edge 12 to the opposing cicuit board C1 surface 21 of approximately 3.5 in.

The spacing of the card edges 10, 12 from their respective ends of the circuit board C1 would be as required in the specifications for the appropriate interface standard with the pin or contact spacing on the card edges being as required by the interface standard. The circuit board C1 could be shorter and be what is referred to as "half-length," and would have similar height values.

Figure 2:
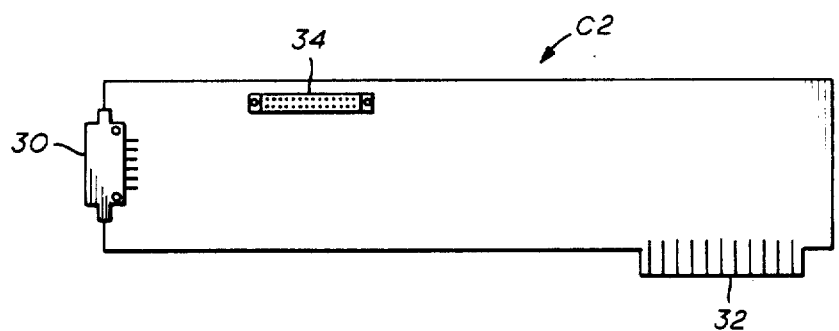
FIG. 2 is a side view of a circuit board according to the present invention utilizing an interface on one side, a different interface on one end and having an external device connector on the face of the circuit board.

In an alternate embodiment, a circuit board C2 (FIG. 2) can utilize a pin and socket connection system forming the connection between the circuit board C2 and the moter board. A male pin connection 30 is located at one end of the circuit board C2 with a card edge 32 developed on one side of the circuit board C2. The circuit board C2 can be utilized in computer systems having different physical interface requirements such as the pin and socket connector on one side or location and a card edge at an alternate location. For example, a circuit board C2 can be utilized in a computer system utilizing the "VMEbus" interface standard and a computer system using the "Industry Standard Architecture" and "PC/XT/AT" interface standard.

The circuit board C2 includes a pin and socket header or connector 34 for cooperation with a ribbon cable and plug for connection to external devices such as disk drives, tape drives, and printers as are commonly used in and with computer systems.

Figure 3:
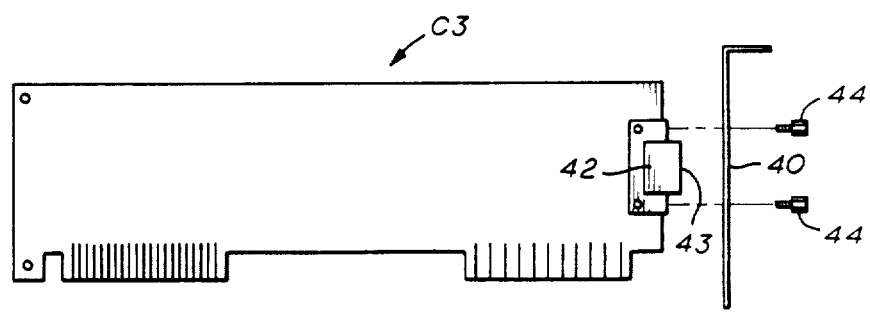
FIG. 3 is a side view of a circuit board according to the present invention having two interfaces located on the same side and showing an end plate attached to a connector located on one end of the circuit board.

A circuit board C3 (FIG. 3) has the interfaces or connections to the mother board located on the same side of the circuit board C3. In this case, the circuit board C3 would be rotated 180 degrees about its vertical axis for installation in an alternate system. An end plate 40 may be installed on the circuit board C3 by means of positive connections to an external device connector 42, such as those commonly used for monitor and serial communications ports, located on the circuit board C3. The end plate 40 has holes located so that the protruding portion 43 of the connector 42 may fit through the end plate 40 and holes located so that screws 44 may be inserted into the connector 42, the screws 44 effectively mounting the end plate 40 to the circuit board C3, eliminating the need for additional connections between the end plate 40 and the circuit board C3.

Figure 4:
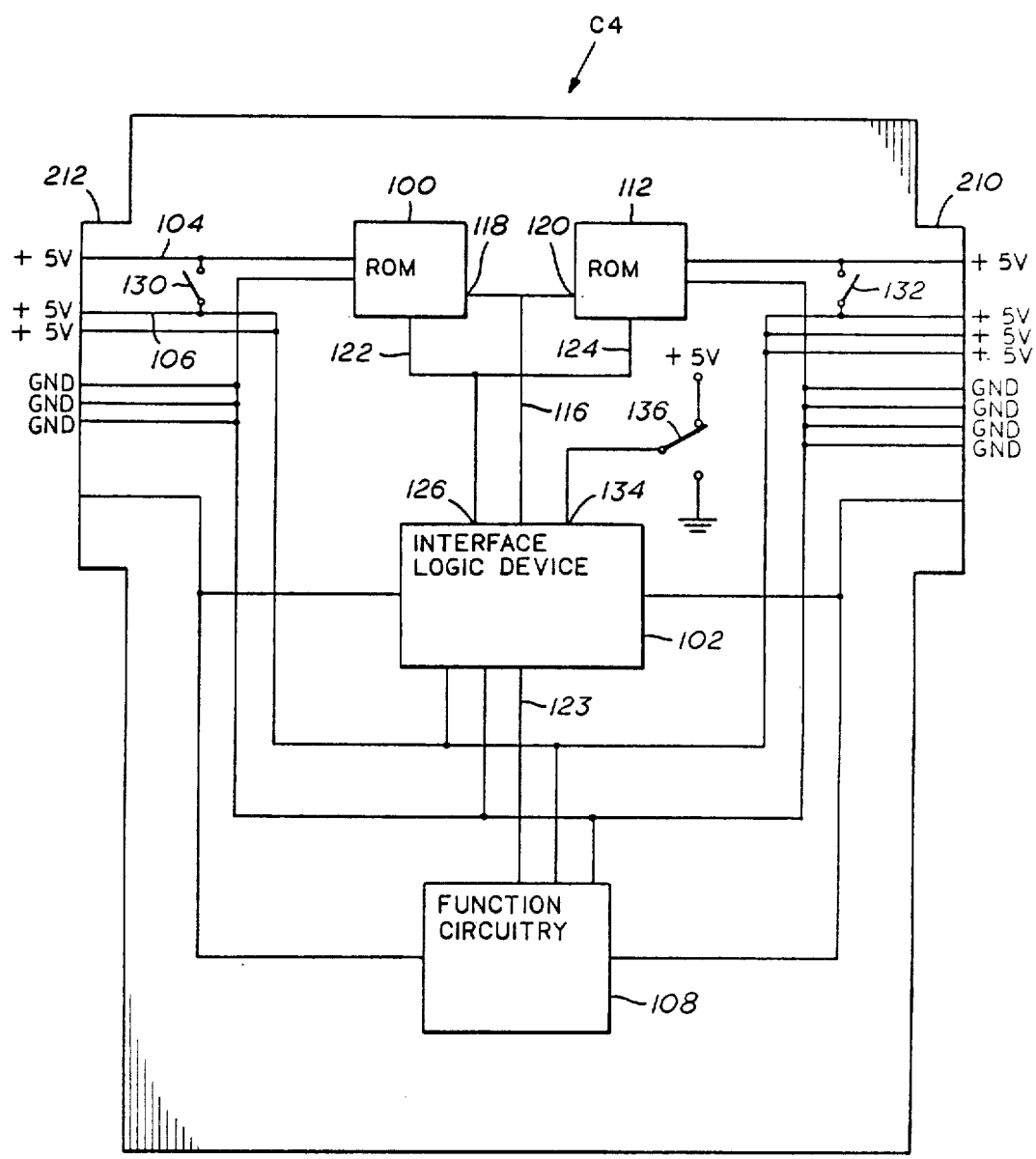
FIG. 4 is a schematic block diagram of a circuit according to the present invention for allowing selection of the appropriate circuitry based on the interface standard being used.

When a circuit board C4 according to the present invention is inserted into a computer system having an interface standard compatible with one of those on the circuit board C4, it is desirable to automatically determine which of the interfaces 210, 212 (FIG. 4) is in use and automatically configure the circuitry on the circuit board C4 to interact with the selected standard. Generally, each interface standard utilizes a plurality of equal voltage power connections or lines, generally five volts. One of these power lines 104 is routed from card edge 212 to the power supply pin of a read only memory (ROM) 100. The remaining power lines 106 are connected together and provide power for the remaining components on the circuit board C4, such as an interface logic device 102 and function circuitry 108. A single power line 110 from the other card edge 210 is connected to a second ROM 112 with the remaining power lines 114 from card edge 210 being connected together, to the power lines for the remaining circuitry and to the power lines 106 from the other card edge 212.

Upon application of power to the circuit board C4, the interface logic device 102 transmits an addressing signal 116 to the inputs 118, 120 on the two ROM's 100, 112. In response to this addressing signal 116, the ROM's 100, 112 produce an output data stream representative of their contents. The data output 122 from the first ROM 100 and the data output 124 from the second ROM 112 are connected to a data input 126 of the interface logic device 102. When one of the ROM's 100, 112 is providing data in response to the addressing signal 116, the interface logic device 102 receives this incoming data stream into a series of logic elements contained in the interface logic device 102. The states or values of these logic elements are combined with various gates and functions, also preferably located in the interface logic device 102, to develop the proper control signals, routing and sequences required for use with the active interface standard and for interaction with the function circuitry 108 to allow it to function to the active standard. Thus, a series of data bits is used to alter, or enable and disable as appropriate, the circuitry and programming of the interface logic device 102 so that the appropriate interface standard and its protocols are used.

Preferably the ROM's 100, 112 are serial devices. In that case the addressing signal 116 is a clocking signal applied to clocking inputs and the output data stream is a serial bit stream. The use of serial ROM's is preferred to save cost and space on the circuit board C. Alternatively, the ROM's 100, 112 can be conventional parallel output devices. The addressing signal is then a parallel signal providing appropriate memory addresses, with the output data stream being a parallel bit stream. The ROM's 100, 112 can also be programmable logic arrays and other suitable storage devices, depending on the space available, the amount of data to be transferred and the requirements of the interface logic device 102 utilized in a particular configuration.

Only one ROM 100, 112 will be activated at a time because the cirucit board C4 will be installed in only one mother board at a time. Therefore, there is no conflict in the information provided to the interface logic device 102 because the alternate ROM is not supplied with power. Because it is not powered, it will not interfere with the data being provided by the powered ROM.

The remaining necessary interface standard signals are provided from the card edges 210, 212 to the interface logic device 102 and to the function circuitry 108 as appropriate. Additionally, control signals 123 are provided from the interface logic device 102 to the function circuitry 108 to control the operation as necessary and as desired, depending upon the actual functions being performed by the circuit board C4 and the active interface standard.

Alternatively, the ROM's 100, 112 can have their power connections made to the common power lines on the circuit board C4 with switches 130, 132 in the lines to allow the desired ROM 100, 112 to be manually disabled by the user.

As yet another alternative, the interface logic device 102 can have a selection input 134. The selection input 134 can be switched to a high or low state by means of a selection switch 136. The interface logic device 102 samples this selection input to determine which interface standard has been selected and configures and activates itself appropriately. In this alternative the ROM's 100, 112 are not necessary.

The interface logic device 102 may be any acceptable product such as a programmable logic array, a gate array, a logical array and other similarly configurable devices.

The circuit board C can be effectively utilized by a computer system manufacturer. The system manufacturer makes a computer system having different interface standards but similar functionality. The system manufacturer only installs in the circuit board C the necessary components for the desired system into which it will be installed. This reduces the quantity of different circuit boards needed the by system manufacturer, increases circuit board volume, and reduces design time.

The circuit board C can be effectively utilized by the board manufacturer supplying product to the after market or to original equipment manufacturers. The board manufacturer would supply the components needed for use with all the systems for which the circuit board C is designed. This multiple use of a circuit board C allows the board manufacturer to increase volume of one design and decrease overall inventory at the same time.

While all of the illustrated embodiments show the use of only two different interface standards on a circuit board, the invention is not so limited and circuit boards according to the present invention could have a greater number of interface standards present on a single circuit board.

The foregoing disclosure and description of the invention are illustrative and explanatory thereof, and various changes in the size, shape and materials, as well as in the details of the illustrative construction may be made without departing from the spirit of the invention, all such changes being contemplated to fall within the scope of the appended claims.

We claim:

1. A circuit board for use with systems having a mother board for inclusion of additional circuit boards in the systems, the interfaces between the mother boards and the additional circuit boards of first and second systems conforming to first and second mutually incompatible interface standards, comprising:
   circuit board means for locating and connecting circuitry and for connection to a mother board,
   said circuit board means having a first interface means for connecting said circuit board means to the first interface standard, said first interface means being located on a side of said circuit board means, and
   said circuit board means having a second interface means for connecting said circuit board means to the second interface standard, said second interface means being located on a side of said circuit board means.

2. The circuit board of claim 1, wherein said first interface means and said second interface means are located on different sides of said circuit board means.

3. The circuit board of claim 2, wherein said first and second interface means are located on opposite sides of said circuit board means.

4. The circuit board of claim 3, wherein said first and second interface means are located on opposite ends of said circuit board means.

5. The circuit board of claim 1, wherein one of said connection means is a card edge for mating with an edge connector located on the mother board.

6. The circuit board of claim 1, wherein one of said connection means is a pin and socket connector.

7. The circuit board of claim 1, wherein said circuit board means includes means for connecting an end plate to said circuit board means.

8. The circuit board of claim 7, wherein said end plate connection means includes means for connecting said end plate to an electronic circuit connector located on an end of said circuit board means.

9. The circuit board of claim 1, further comprising: means for interconnecting the circuitry located on said circuit board means to cooperate with the active interface standard.

10. The circuit board of claim 9, wherein said interconnecting means includes means for sensing which of said connection means is active and producing an output indicative thereof.

11. The circuit board of claim 10, wherein said means for sensing the active connection means utilizes a power supply line of said connection means.

12. The circuit board of claim 10, said interconnecting means further including means for enabling portions of circuitry and disabling portions of circuitry located on said circuit board means in response to said output of said active connection sensing means.

13. The circuit board of claim 12, wherein said means for enabling and disabling includes a programmable logic device connected to said circuitry located on said circuit board means and means for providing input data to said programmable logic device to allow said programmable logic device to enable and disable portions of said circuitry.

14. The circuit board of claim 13, wherein said means for providing input data to said programmable logic device includes a read-only memory.

* * * * *

Notice of Adverse Decisions in Interference

In Interference No. 102,705, involving Patent No. 4,885,482, D. P. Sharp, C. H. Lee, T. Cassidy, MULTIPLE COMPUTER INTERFACE CIRCUIT BOARD, final judgment adverse to the patentees was rendered June 2, 1992, as to claims 10-14.

*(Official Gazette August 25, 1992.)*